(12) United States Patent
Acuff et al.

(10) Patent No.: US 8,103,473 B2
(45) Date of Patent: Jan. 24, 2012

(54) TEST AND MEASUREMENT INSTRUMENT AND METHOD OF CALIBRATING

(75) Inventors: Ronald A. Acuff, Portland, OR (US); Lester L. Larson, Portland, OR (US); Kevin E. Cosgrove, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 512 days.

(21) Appl. No.: 12/251,747

(22) Filed: Oct. 15, 2008

(65) Prior Publication Data
US 2009/0125269 A1    May 14, 2009

Related U.S. Application Data

(60) Provisional application No. 60/987,323, filed on Nov. 12, 2007.

(51) Int. Cl.
*G01R 35/00* (2006.01)

(52) U.S. Cl. .................. 702/107; 600/509; 702/117
(58) Field of Classification Search .................. 702/106, 702/107, 108, 117, 118, 120, 121, 123, 176; 701/29; 600/509, 522, 523; 324/628
See application file for complete search history.

(56) References Cited

U.S. PATENT DOCUMENTS 6,615,073 B1 * 9/2003 Panescu et al. ............... 600/509

* cited by examiner

*Primary Examiner* — John H Le
(74) *Attorney, Agent, or Firm* — Derek Meeker; Thomas F. Lenihan

(57) ABSTRACT

A test and measurement instrument and a method of calibrating the test and measurement instrument including a reference signal generator; multiple input channels; and multiple input circuits. Each input channel is coupled to a corresponding input circuit; and one of the input circuits is coupled to the reference signal generator.

16 Claims, 4 Drawing Sheets

TEST AND MEASUREMENT INSTRUMENT AND METHOD OF CALIBRATING

CROSS-REFERENCE TO RELATED APPLICATIONS

This application claims priority under 35 U.S.C. §119(e) from U.S. Provisional Application Ser. No. 60/987,323, filed on Nov. 12, 2007 the contents of which are herein incorporated by reference in their entirety.

BACKGROUND

This disclosure relates to test and measurement instruments, in particular to test and measurement instruments and methods of calibrating the same using an internal reference.

Logic Analyzers are test and measurement instruments that include a large number of channels used to test digital data on a device under test. During calibration, manufacturing, or the like, setup times and hold times can be measured for individual channels. In addition, skew between channels can be measured.

To perform such measurements, the channels of the logic analyzer are driven with a calibration signal. However, at least one of the channels, and possible one entire probe attached to the logic analyzer would be driven with a signal used as a reference signal to trigger acquisition. As that channel and/or probe was used for triggering, the performance of that channel could not be simultaneously measured. Once the measurements were performed, the test setup is changed so that input channel used as the reference signal can be driven. However, a different one of the input channels must then be used for the reference signal to measure that channel.

SUMMARY

An embodiment includes a test and measurement instrument including a reference signal generator; multiple input channels; and multiple input circuits. Each input channel is coupled to a corresponding input circuit; and one of the input circuits is coupled to the reference signal generator.

Another embodiment includes a test and measurement instrument including multiple input channels with each input channel to receive a corresponding input signal; and an oversampler to oversample each input signal. For each oversampled input signal, the instrument includes a plurality of sample point select circuits, each sample point select circuit to select a sample of the corresponding oversampled input signal as an output sample. The instrument also includes a cross-point switch to route the output samples of the sample point select circuits to a plurality of output channels.

Another embodiment includes calibrating a test and measurement instrument including generating a reference signal in a test and measurement instrument; receiving the reference signal in a first input circuit; outputting the reference signal; receiving the outputted reference signal in a second input circuit; and sampling the reference signal received by the second input circuit in response to the reference signal received by the first input circuit.

DETAILED DESCRIPTION

Embodiments include test and measurement instruments and techniques of calibrating. As described above, the setup used in performing measurements had to be changed in order to characterize the input channel that was originally used as a reference input. However, the change in the setup can introduce errors in the calibration. However, in an embodiment, the test and measurement instrument can be calibrated using a reference coupled to an input circuit. By using the reference for the desired channels of the instrument, the channels can be calibrated to a common reference with a reduced impact from external test fixtures used in the calibration.

Figure 1:
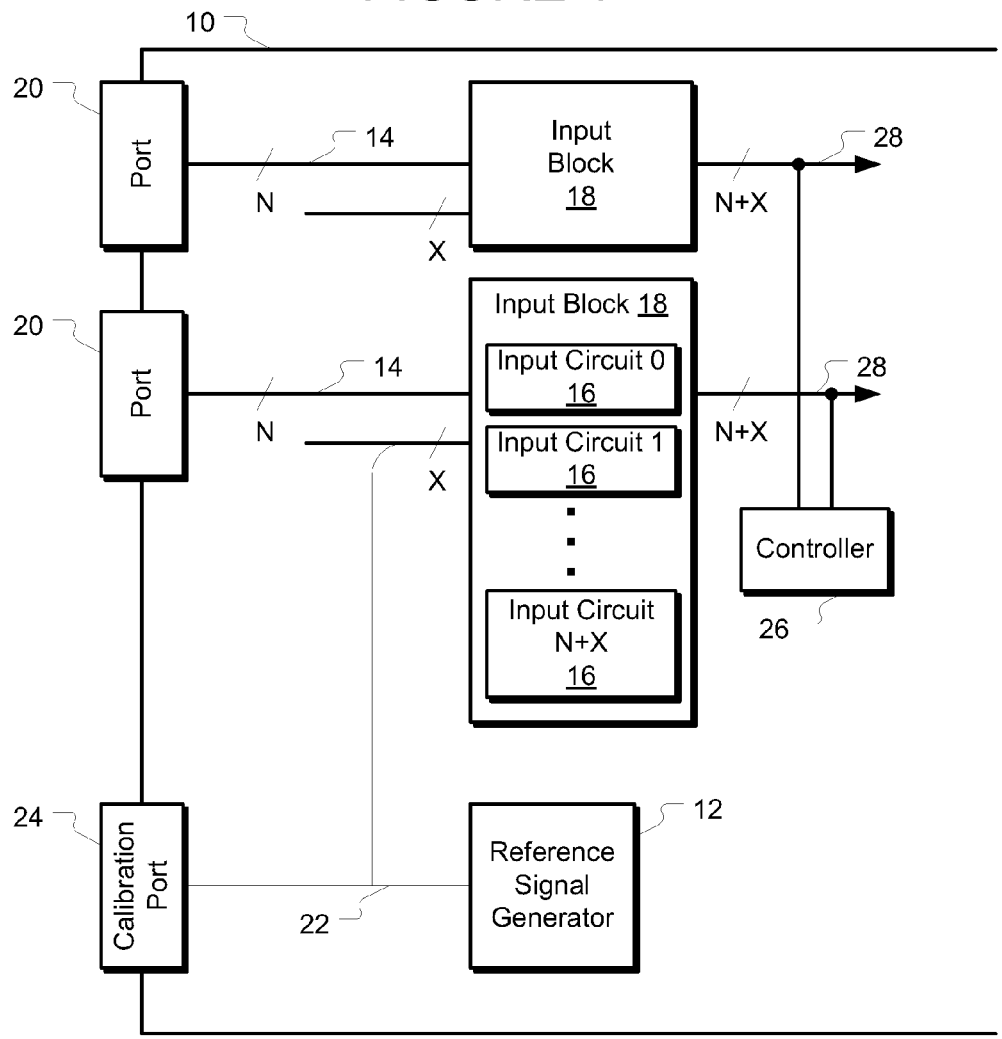
FIG. 1 is a block diagram of a test and measurement instrument according to an embodiment.

FIG. 1 is a block diagram of a test and measurement instrument according to an embodiment. The instrument 10 includes a reference signal generator 12, multiple input channels 14, and multiple input circuits 16. In this embodiment, the input circuits are grouped into blocks 18. The blocks 18 are coupled to ports 20 through the input channels 14.

Each of the input channels 14 is coupled to a corresponding input circuit 16. As used herein, an input channel 14 includes the circuitry, components, connections, or the like that couple the port 20 to the input circuits 16. An input circuit 16 can include the circuitry associated with processing, sampling, or otherwise manipulating a signal on an input channel 14. In an embodiment, the instrument 10 can be a logic analyzer. The ports 20 can be connectors for connecting one or more probes the instrument 10. Such a probe can have multiple channels, such as data channels, clock channels, or the like. Signals carried on these channels can be processed by the input circuits 16. In an embodiment, there can be 32 data channels and 2 clock channels in a probe. As a result, the number of input channels 14 can be 34.

However, there can be more input circuits 16 than there are input channels. For example, in this embodiment, there are N input channels and N+X input circuits. As a result, there are additional input circuits 16. Each of these N+X input circuits 16 can form a block 18. However, although multiple blocks 18 have been illustrated, the blocks 18 can, but need not be identical. That is, one block 18 can include N+X input circuits, while another block 18 can include only N input circuits. In an embodiment, each block 18 can correspond to one of the ports 20. That is, a block 18 would processes signals received through the corresponding port 20.

The input circuits 16 can be grouped into multiple blocks 18. For example, each block 18 can be a discrete integrated circuit. In another embodiment, each block 18 can be a logical block of a single integrated circuit. Accordingly, the blocks 18 can represent physical and logical organizations of the input circuits 16. Moreover, although the input circuits 16 have been described as being discrete, input circuits 16 can share common circuitry, functionality, and the like.

Regardless of how the input circuits 16 are grouped, in an embodiment, there is at least one input circuit more than there are input channels 14. For example, at least one input block 18 can include a number of input circuits 16 greater than a number of input channels 14 of the corresponding port 20. In another example, there can just be additional input circuits 16 greater than the number of input channels 14 regardless of how the input circuits 16 are grouped.

One of these input circuits 16 is coupled to the reference signal generator 12. Accordingly, the reference signal 22 can be received by one of the input circuits 16. In particular, the reference signal 22 can be received by one of the input circuits 16 that is not coupled to one of the input channels 14. In other words, an additional input circuit 16 can be used to process the reference signal 22.

The reference signal generator 12 is configured to generate a signal that includes a transition. For example, a reference signal 22 generated by the reference signal generator 12 can be a square wave, a pulse, a pseudorandom bit sequence, or the like. Any circuitry, such as oscillators, pattern generators, or the like can be used as the reference signal generator 12. In an embodiment, any signal that can be used to trigger an acquisition on the instrument 10 can be generated as a reference signal 22 by the reference signal generator 12.

Although only one block 18 has been illustrated as having an input circuit 16 that is coupled to the reference signal generator 12, any number, including all of the blocks 18 can include an input circuit that is coupled to the reference signal generator 12.

In an embodiment, the instrument 10 can include a calibration port 24. The reference signal 22 can be output from the instrument 10 through the calibration port 24. As will be described in further detail below, the calibration port 24 can be used during calibration to provide the reference signal 22 as input signal through the ports 20.

Figure 2:
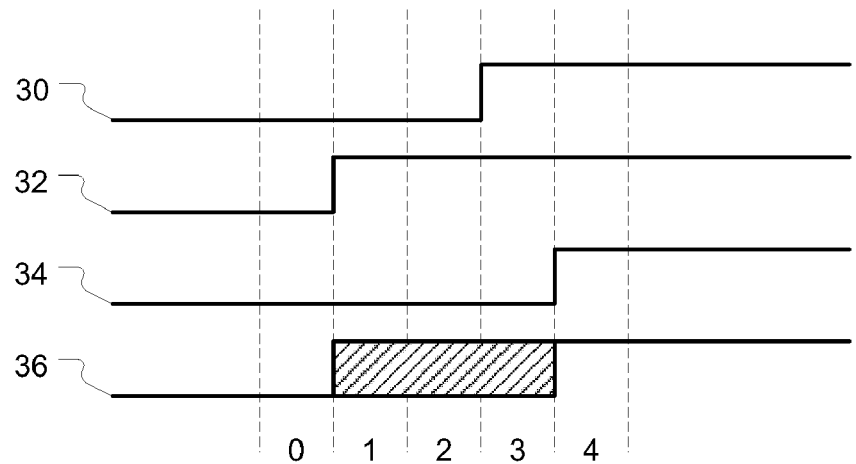
FIG. 2 is a timing diagram illustrating contributions to a transition region of a sampled signal.

FIG. 2 is a timing diagram illustrating contributions to a transition region of a sampled signal. Three sampled signals 30, 32, and 34 are illustrated relative to five samples 0-4. Each of the sampled signals 30-34 were sampled using a trigger with a substantially fixed relationship to the sampled signal. For example, the reference signal 22 of FIG. 1 can be input through one of the ports 20. Accordingly, the reference signal 22 can be sampled. Since the reference signal 22 is also input to one of the input circuits 16 internal to the instrument 10, the same reference signal 22 can be used to trigger acquisitions. Accordingly, there can be a particular time relationship between the trigger and the signal that is sampled to generate the sampled signals 30-34.

However, due to performance limitations, noise, instability, or the like, there can be a number of samples over which the same sample relative to the trigger is not stable from acquisition to acquisition. In this example, samples 0-4 are relative to the trigger. In samples 1-3, there are differences in sampled values for the similar samples. The samples over which the sampled signal is unstable is referred to as a transition region. Signal 36 represents the unstable samples where the shaded region indicates where samples are unstable. Samples 0 and 5 are stable in this example.

In an embodiment, the samples illustrated in FIG. 2 can be acquired through oversampling. Oversampling as used herein is the sampling of a signal at a rate that is greater than a data rate for that signal. In other words, multiple samples can be acquired for each bit of a signal. For example, the region of samples 0-4 can correspond to a transition region of a signal that is smaller in time than the entire bit. Accordingly, multiple samples would be acquired over the time span of the bit.

Although a binary signal has been used as an example, any number of levels can be used. Accordingly, an unstable sample would refer to a sample period relative to the trigger over which the sampled value is not stable. That is, any change between levels can be interpreted as unstable.

In a particular example, as described above, the reference signal 22 can be used both as a trigger and as the signal to be sampled. Accordingly the sampled signals 30-34 can represent an edge of the reference signal 22 sampled at a time relative to that edge or another edge of the reference signal. Accordingly, there can be a substantially known time relationship between the trigger and the sampled signal. As a result, the variation in the samples can be interpreted as the performance limitations, noise, instability, or the like and used for subsequent calibration.

Referring to FIG. 1, the instrument 10 can include a controller 26. The controller 26 can be configured to receive the sampled signals 28. From the sampled signals, as described above the controller 26 can determine a transition region of an input signal received through one of the input channels 14 relative to the reference signal 22. In particular, the controller 26 can be configured to determine samples of the input signal relative to the reference signal 22 that are unstable. The controller 26 can be any variety of circuitry. For example, the controller can be an application specific integrated circuit, an appropriately programmed processor, a programmable gate array, or the like.

Figure 3:
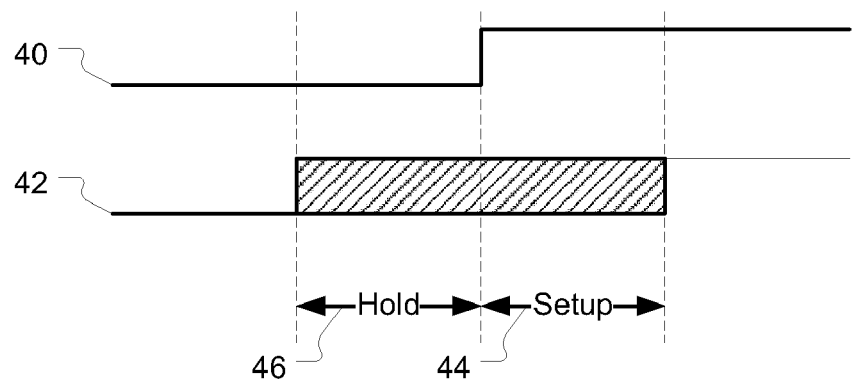
FIG. 3 is a timing diagram illustrating a transition region of a sampled signal used to establish as setup time and a hold time according to an embodiment.

FIG. 3 is a timing diagram illustrating a transition region of a sampled signal used to establish a setup time and a hold time according to an embodiment. Signal 40 is the signal that is sampled by an input circuit 16 described above. Signal 42 is the composite signal indicating unstable samples. Accordingly, a setup time 44 and a hold time 46 can be determined. In this example, the setup time 44 is the time between the transition of the signal 40 to the time when the signal 42 becomes stable. Similarly, the hold time 46 is the time between the transition of the signal 40 and the time when the signal 42 becomes unstable.

Although this example has been described with respect to time, time can be represented by samples. As described above, the transition region can be represented by a number of samples over which the sampled signal is not stable. Accordingly, the time used for the setup time or hold time can be represented as a number of samples. Moreover, even if determined as a number of samples, the time can be represented in units of time by using the sample time.

Figure 4:
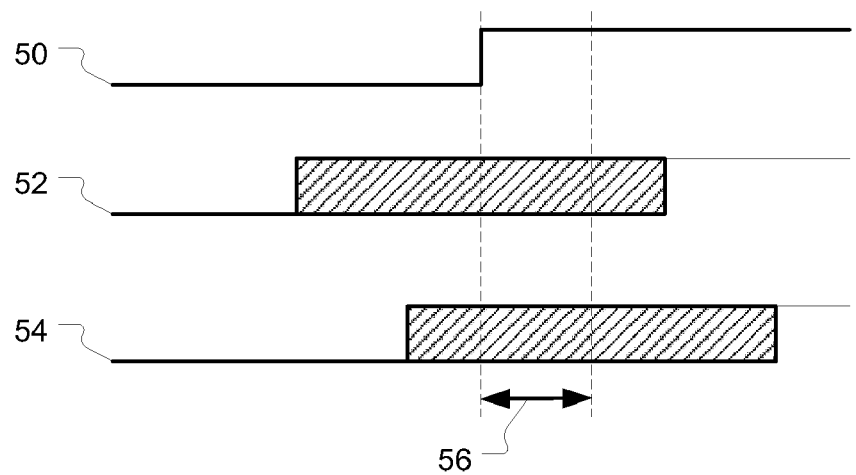
FIG. 4 is a timing diagram illustrating transition regions of multiple sampled signals used to deskew the signals.

FIG. 4 is a timing diagram illustrating transition regions of multiple sampled signals used to deskew the signals. As described above one input signal can be sampled to establish a transition region. However, multiple input circuits can OVERSAMPLE substantially similar input signals. Similar to FIG. 3, signal 50 is the signal that is input to two or more input circuits 16. Signals 52 and 54 represent the composite signals indicating unstable samples for the respective signals.

However, due to differences in the input circuits 16, input channels 14, or the like, the same signal input to two different input circuits 16 may result in a skew between the signals. Accordingly, the transition regions of the signals can be used to determine the skew between the signals and/or deskew the signals. For example, in FIG. 4, skew 56 represents the skew between the signals 52 and 54. As the same or a substantially similar input signal was input to both input circuits, the time difference between the transition regions can be used to determine the skew. In this example, the skew 56 is the time or samples between the centers of the transition regions. Any other time relationship between the transition regions can be used as an indication of the skew. For example, a beginning or end of the transition regions can be used to determine the skew.

Referring back to FIG. 1, the test and measurement instrument can include the controller 26. The controller 26 can be configured to receive the sampled signals 28. In an embodiment, the controller 26 can include a processor configured to receive and manipulate the sampled signals 28. For example, the controller 26 can be configured to determine a transition region of an input signal received through one of the input channels relative to the reference signal, as described above. Accordingly, the controller 26 can be configured to determine setup times, hold time, deskew channels, or the like, as described above.

Figure 5:
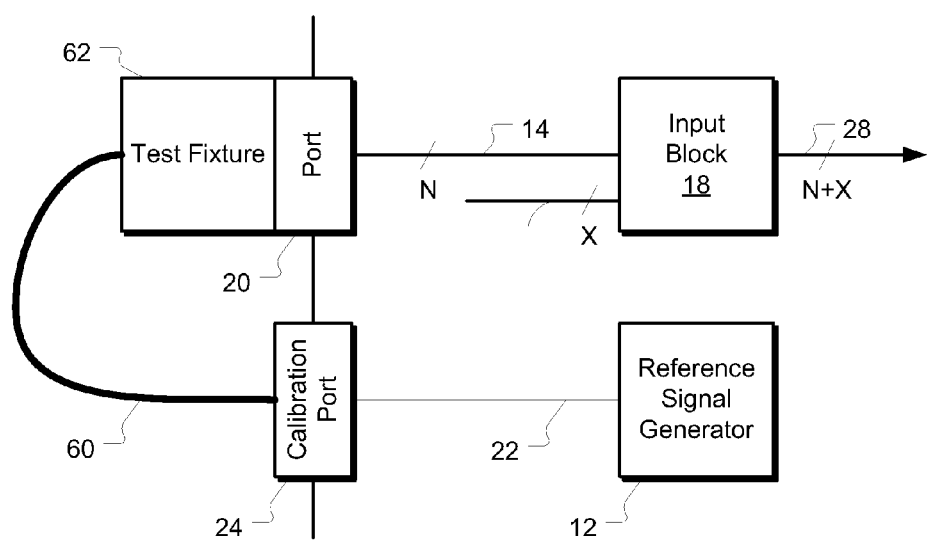
FIG. 5 is a block diagram of a test and measurement instrument while calibrating the instrument according to an embodiment.

FIG. 5 is a block diagram of a test and measurement instrument while calibrating the instrument according to an embodiment. In this embodiment, a test fixture 62 is connected to a port 20 of the instrument 10. The test fixture 62 is also connected to the calibration port 24 through cable 60.

Accordingly, the reference signal 22 can be generated by the reference signal generator 12 in the instrument 10. As the reference signal generator 12 is coupled to an input circuit 16, the reference signal 22 can be received by that input circuit 16. Moreover, the reference signal 22 is output through the calibration port 24, then input through the port 20 using the test fixture 62. As a result, the reference signal 22 can be received and sampled by an input circuit 16. In particular, the reference signal 22 can be sampled in response to the reference signal that was coupled to another input circuit using that reference signal as a trigger.

Accordingly, transition regions of the input circuits 16 can be determined as described above. In particular, sample periods relative to the reference signal can be analyzed to determine if there are unstable samples. As described above, setup times, hold times, and skew can be determined from measurements on individual and multiple input circuits.

Similar to the sampling described with reference to FIG. 2, the reference signal received through the port can be oversampled. That is, for a transition of the reference signal, used as a trigger, multiple samples of received reference signal can be acquired. In particular, multiple samples can be acquired while the received reference signal is transitioning.

The acquired samples for multiple transitions of the reference signal, and/or multiple triggered acquisitions due to the reference signal can be combined together. The combination can include determining if a sample position relative to the reference signal is unstable if a value of the sample in the same position relative to the reference signal changes with respect to the plurality of transitions of the reference signal.

Using the test fixture 62, the reference signal 22 can be input to any or all of the input circuits 16 coupled to the input channels 14. Accordingly, the unstable samples of the sampled reference signal received by the input circuits can be determined. As described above, the time alignment of the unstable samples can be used to determine a skew between the input circuits. Moreover, with a test fixture 62 that can input the reference signal 22 to all of the input channels 14, setup time and hold time for individual channels and skew between channels can be determined substantially simultaneously. That is, the measurements can be made without the need to change the calibration setup. In particular, the input connections to the ports 20 need not be changed to calibrate each channel.

Figure 6:
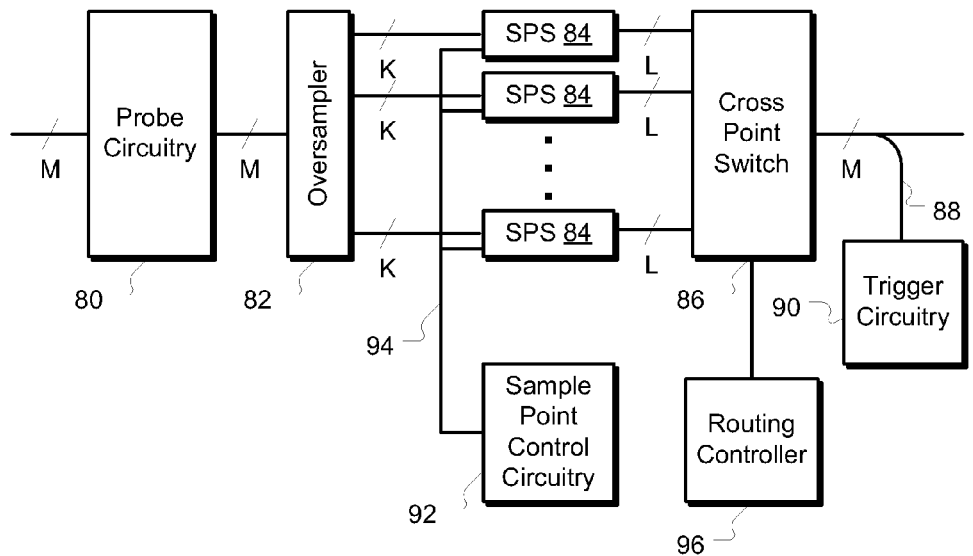
FIG. 6 is a block diagram of an input block of a test and measurement instrument according to an embodiment.

FIG. 6 is a block diagram of an input block of a test and measurement instrument according to an embodiment. The probe circuitry 80 and oversampler 82 can include analog to digital converters (ADC), buffers, comparators, threshold control circuitry, or the like. Any circuitry that can convert a signal into digitized data can be used as the probe circuitry 80.

In particular, each of the M input channels of the probe circuitry 80 can include its own threshold control. Accordingly, a single threshold need not be set for a group of multiple channels. As a result, an input signal provided to a channel can have a threshold that is optimized for that signal without having to accommodate characteristics of any other input signal. For example, each of the M input channels can have its own associated digital to analog converter (DAC). The threshold for each of the M input channels can be set independently. Accordingly, each of the M input channels can be used as any type of channel. For example, a clock signal and data signals may have different thresholds. Since the threshold can be controlled for each channel independently of the other channels, any channel can be used as a clock channel as desired. Although the thresholds for each channel have been described as independent, the thresholds can, but need not be different. For example, the DACs for two different channels can be programmed with the same value.

Figure 7:
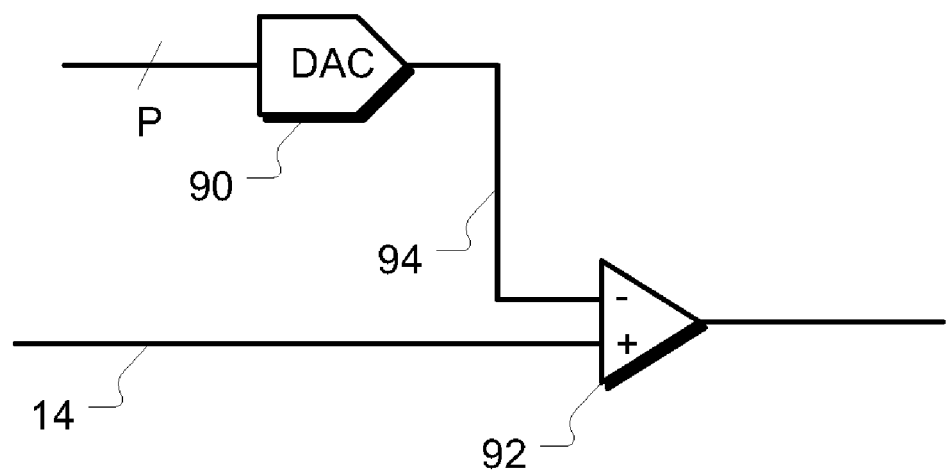
FIG. 7 is a block diagram of threshold control for an input circuit of a test and measurement instrument according to an embodiment.

FIG. 7 is a block diagram of threshold control for an input circuit of a test and measurement instrument according to an embodiment. An input channel 14 is coupled to a comparator 92. The comparator has a threshold voltage 94 that is controllable by the digital to analog converter (DAC) 90. The DAC 90 is configured to receive a P bit input signal to generate the threshold voltage 94. In an embodiment, each input circuit 16 can include such circuitry to couple to an input channel 14. As a result, each channel can be independently controlled.

Referring to FIG. 6 again, each of the M input signals can be oversampled in the oversampler 82. In this embodiment, the oversampler 82 is configured to provide K signals, each representing a sample of a corresponding one of the M signals provided by the oversampler 82. In an embodiment, K can be 2, 4, 64, or the like according to an oversample factor. Each set of K signals corresponding to one of the M oversampled input signals is input to a sample point select circuit (SPS) 84.

The SPS 84 is configured to select one or more of the K samples as the output samples L. In an embodiment L is less than K. For example, K can be 64, meaning that 64 samples are provided for each of the M channels. In this example, L can be 4, meaning that 4 of the 64 samples are selected to be provided to the cross point switch 86. In an embodiment, a sample point controller 92 can generate sample point select signals 94. The sample point select signals 94 can be provided to the SPS 84. In response the SPS 84 can select from among the K samples for the L output samples.

The sample point select signals can, but need not be the same signal. For example, the sample point select signals 94 can be a plurality of signals where each SPS 84 is configured to receive a subset of the sample point select signals 94. That is, each SPS 84 can receive multiple sample point select signals 94. For example, each of the sample point select signals 94 that an SPS 84 receives can correspond to one of the L output samples.

In an embodiment, the L samples output from an SPS 84 can, but need not correspond to different samples of the K samples. In fact, each of the L output samples can correspond to the same sample of the K samples. Moreover, although one SPS 84 has been described for each set of K samples, a single SPS 84 can have multiple sample select circuits. For example, each such sample point select circuit can be configured to select a sample of the corresponding oversampled input signal as an output sample. That is, an SPS 84 can be implemented as a unitary circuit that provides multiple output samples, or can be implemented as individual sample select circuits configured to provide one of the output samples.

The cross point switch 86 is coupled to the SPS 84. The cross point switch 86 is configured to route any of the sets of L samples to any of the M outputs. In an embodiment, the cross point switch 86 can route the L samples to the M outputs in response to a routing controller 96. Accordingly, through the entire signal chain, a signal that is input on any of the M input channels can be processed and routed to any of the outputs of the cross point switch 86. Accordingly, any of the input channels M, input to the probe circuitry 80 can be used for data inputs, triggers, or the like.

For example, a logic analyzer may have dozens of probes, each with more than one hundred individual channels. Accordingly, there is a possibility for error when the multiple channels of the logic analyzer are connected to a device under test (DUT). In another example, a DUT may have an error in layout such that two or more signals have been crossed relative to a probe location on the DUT. After realizing such an error, the routing controller 96 can be configured to receive a user input indicating a channel configuration. This channel configuration can be modified from an initial setup that assumed proper connection of the probes to the DUT and the proper layout of the DUT. Using the modified channel configuration the routing controller 96 can configure the cross point switch 86 to reroute channels such that the error has no effect. Accordingly, errors that previously would have required rerouting of probes, a new layout of a DUT, or the like, can be cured through the proper configuration of the cross point switch 86.

FIG. 6 illustrates that input circuitry 16 of an input block 18 of FIG. 1 can, but need not have a fixed configuration. For example, the input block 18 of FIG. 6 can be configured to route any M input channel to any M output channel. Thus, the circuitry forming any given input circuit 16 can change based on the configuration. Accordingly, in an embodiment, an input circuit 16 can refer to the path taken by the signal through the input block 18. Moreover, although FIG. 6 has been described as a single input block 18, the circuitry can form input circuits 16 from multiple input blocks 18. That is, the input circuits 16 can be distributed as desired.

Furthermore, in an embodiment, the test and measurement instrument can include trigger circuitry 90. The trigger circuitry 90 can be configured to trigger an operation of the test and measurement instrument, such as a data acquisition. The trigger circuitry 90 is coupled to an output channel 88 of the M output channels. As the cross-point switch 86 can be configured to route any of the L output samples of the sample point select circuits 84 to any of the M output channels, effectively, any of the M input signals input to the test and measurement instrument can be used for triggering.

Although only one channel has been described, any to all of the M output channels can be coupled to the trigger circuitry 90. In an embodiment, the trigger circuitry 90 can include a pattern recognizer. The pattern recognizer can monitor the various channels for a particular pattern in the input signals. This pattern can be used as a trigger. However, using the example above where probes are incorrectly connected, when the cross point switch 86 is configured to overcome the incorrect probe connections, the pattern to accommodate the incorrect connections is not necessary.

Moreover, the trigger circuitry 90 can be configured to recognize a range of a set of input signals. For example, eight input signals can form an eight bit word. The instrument can be configured to perform an operation based on a range of a value of the word. However, if any connections are crossed, the significance of the bits will be incorrect. By configuring the cross point switch 86, the significance of the bits can be restored to the correct order, eliminating the need for special processing when interpreting a range.

Although particular circuitry has been described for the various components of an input circuit 16, the input circuit and/or portions of the input circuit can be implemented in one or more programmable logic devices, gate arrays, application specific integrated circuits, or the like. Accordingly, even though components have been described as discrete, such components and/or portions thereof can be implemented in the same integrated circuit.

Although a logic analyzer has been given as an example of a test and measurement instrument, an embodiment can include other types of test and measurement instruments. For example, a digitizing oscilloscope with multiple channels can include the circuitry described above. Any multiple channel instruments capable of operating with digitized data can include the circuitry described above.

An embodiment can include means for generating a reference signal; means for outputting the reference signal from the test and measurement instrument; and means for sampling a plurality of input signals. The means for sampling the input signals is coupled to the means for generating the reference signal such that the means for sampling can sample the reference signal as one of the input signals.

The means for generating the reference signal can include any circuitry capable of generating a repeating signal. For example, an oscillator, a pattern generator, a processor output or the like can be used as the means for generating the reference signal.

The means for sampling the input signals can include any circuitry capable of sampling a signal. For example, comparators, ADCs, sample and hold circuitry, or the like can all be part of the means for sampling.

In an embodiment, the test and measurement instrument can include means for triggering the means for sampling in response to any of the input signals; and means for calibrating the test and measurement instrument when the reference signal is selected for triggering. For example, the means for triggering the means for sampling can include the controller 26 described above, and any circuitry used to generate internal signals to control the sampling and/or other functions related to triggering.

The means for calibrating the test and measurement instrument can include any circuitry capable of processing the input signals and controlling the acquisition according to the calibration. For example, the means for calibrating can include a processor to manipulate the sampled signals when the reference signal has been used as a trigger, circuitry to control the sampling when a setup time and a hold time have been determined, or the like.

In an embodiment, the test and measurement instrument can include means for determining at least one of a setup time and a hold time in response to unstable samples acquired by the means for sampling. In another embodiment, the test and measurement instrument can include means for determining a skew between a plurality of the input signals in response to unstable samples acquired by the means for sampling. Such means for determining the setup time, hold time, and skew can include the controller 26 described above.

Another embodiment includes an article of machine readable code embodied on a machine readable medium that when executed, causes the machine to perform any of the above described operations. An embodiment includes a machine readable storage medium storing machine readable code that when executed causes the machine to perform any of the above described operations. As used here, a machine is any device that can execute code. Microprocessors, programmable logic devices, multiprocessor systems, digital signal processors, personal computers, or the like are all examples of such a machine.

In an embodiment, the test and measurement instrument is a hardware device. In another embodiment, the test and measurement instrument is a software application. Another embodiment includes a combination of hardware and software. A test and measurement instrument can be implemented by any combination of such hardware and software processing.

Although particular embodiments have been described, it will be appreciated that the principles of the invention are not limited to those embodiments. Variations and modifications may be made without departing from the principles of the invention as set forth in the following claims.

What is claimed is:

1. A test and measurement instrument, comprising:
   a reference signal generator;
   a plurality of input channels; and
   a plurality of input circuits;
   wherein:
   each input channel is coupled to a corresponding input circuit; and
   one of the input circuits is coupled to an output of the reference signal generator; and
   further comprising:
   a calibration port coupled to the output of the reference signal generator;
   wherein the reference signal generator is configured to output a reference signal to both the calibration port and the input circuit coupled to the reference signal generator.

2. The test and measurement instrument of claim 1, further comprising a controller configured to determine a transition region of an input signal received through one of the input channels relative to the reference signal.

3. The test and measurement instrument of claim 2, wherein the controller is further configured to determine samples of the input signal relative to the reference signal that are unstable.

4. The test and measurement instrument of claim 1, wherein the controller is configured to determine at least one of a setup time and a hold time for one of the input circuits in response to the unstable samples associated with that input circuit.

5. The test and measurement instrument of claim 1, further comprising:
   a controller configured to determine transition regions of a plurality of input signals received through the input channels relative to the reference signal
   wherein the controller is further configured to determine a relative timing between transition regions of the input signals.

6. The test and measurement instrument of claim 5, wherein the controller is configured to deskew the input circuits in response to the relative timing.

7. The test and measurement instrument of claim 1, wherein:
   the input circuits are grouped into a plurality of input blocks, each input block corresponding to one of the ports; and
   at least one input block includes a number of input circuits greater than a number of channels of the corresponding port.

8. The test and measurement instrument of claim 7, wherein at least one of the input blocks includes the input circuit coupled to the reference signal generator.

9. A method of calibrating a test and measurement instrument, comprising:
   generating a reference signal in the test and measurement instrument;
   receiving the reference signal in a first input circuit;
   outputting the reference signal;
   receiving the outputted reference signal in a second input circuit; and
   sampling the reference signal received by the second input circuit in response to the reference signal received by the first input circuit
   determining unstable samples of the sampled reference signal received by the second input circuit; and
   determining at least one of a setup time and a hold time for the second input circuit in response to the unstable samples.

10. The method of claim 9, further comprising:
    oversampling the received reference signal relative to a plurality of transitions of the reference signal received in the first input circuit; and
    combining portions of the oversampled reference signal according to the transitions of the reference signal received in the first input circuit.

11. The method of claim 10, further comprising:
    for each transition of the plurality of transitions of the reference signal received in the first input circuit, oversampling the received reference signal; and
    determining a position relative to the reference signal as an unstable sample if a value of the sample in the same position relative to the reference signal changes with respect to the plurality of transitions of the reference signal.

12. The method of claim 9, further comprising substantially simultaneously determining unstable samples of all input circuits of the test and measurement instrument that are coupled to an external port.

13. The method of claim 9, further comprising:
    receiving the outputted reference signal in a third input circuit;
    determining unstable samples of the sampled reference signal received by the third input circuit; and
    determining a skew between the second input circuit and the third input circuit in response to the unstable samples of the second input circuit and the unstable samples of the third input circuit.

14. A test and measurement instrument, comprising:
    a plurality of input channels, each input channel to receive a corresponding input signal;
    an oversampler to oversample each input signal;
    for each oversampled input signal, a plurality of sample point select circuits, each sample point select circuit to select a sample of corresponding oversampled input signal as an output sample; and
    a cross-point switch to route the output samples of the sample point select circuits to a plurality of output channels; and
    further comprising:
    a plurality of comparators corresponding to the input channels; and
    a plurality of threshold voltage circuits, each threshold voltage circuit configured to provide a threshold voltage to a corresponding one of the comparators;
    wherein each threshold voltage is independently controllable.

15. The test and measurement instrument of claim 14, further comprising:

trigger circuitry to trigger an operation of the test and measurement instrument;

wherein:

the trigger circuitry is coupled to one of the output channels; and the cross-point switch is configured to route any of the output samples of the sample point select circuits to the output channel coupled to the trigger circuitry.

16. The test and measurement instrument of claim 14, further comprising:

a controller configured to generate a plurality of sample point select signals;

wherein each sample point select circuit is configured to select the sample of the oversampled input signal in response to a corresponding subset of the sample point select signals.

\* \* \* \* \*